United States Patent [19]

Peckinpaugh

[11] Patent Number: 4,630,220

[45] Date of Patent: Dec. 16, 1986

[54] VOLTAGE CONTROLLER

[75] Inventor: Roger I. Peckinpaugh, Newhall, Calif.

[73] Assignee: Southern California Edison Company, Rosemead, Calif.

[21] Appl. No.: 586,852

[22] Filed: Mar. 6, 1984

[51] Int. Cl.⁴ .......................... H02J 1/00; G01R 19/00

[52] U.S. Cl. ...................................... 364/492; 307/31; 323/257; 364/483; 361/53

[58] Field of Search ............... 364/153, 483, 492, 493, 364/571; 361/52, 53; 323/255, 256, 257, 263; 322/21, 32, 24, 25, 28; 340/646, 661; 307/31, 33; 318/624

[56] References Cited

U.S. PATENT DOCUMENTS

| | | | |
|---|---|---|---|
| 2,694,174 | 11/1954 | Stone | 322/32 |
| 3,089,997 | 5/1962 | Kimbleton | 322/39 |
| 3,235,788 | 2/1966 | Riebs | 323/257 |
| 3,237,091 | 2/1966 | Attewell | 323/257 |
| 3,725,771 | 4/1973 | Gilmore | 323/20 |
| 3,855,519 | 12/1974 | Waldmann | 322/24 |
| 3,895,287 | 7/1975 | Sun et al. | 323/258 |
| 3,908,163 | 9/1975 | Gilmore | 323/257 |
| 3,913,007 | 10/1975 | Gilmore | 323/257 |
| 3,976,925 | 8/1976 | Rudich, Jr. | 318/624 |
| 3,984,755 | 10/1976 | Lehnhoff et al. | 322/28 |
| 3,996,507 | 12/1976 | Chambers | 322/28 |
| 4,063,148 | 12/1977 | Fehlmann et al. | 323/257 |

*Primary Examiner*—Parshotam S. Lall
*Assistant Examiner*—Kevin J. Teska
*Attorney, Agent, or Firm*—Lyon & Lyon

[57] ABSTRACT

A control device for regulating the output voltage of a voltage regulator wherein the output from that regulator would normally be variable includes inputting that voltage to the control device. There are two overlapping bands which define an effective bandwidth between the upper limit of the lower band and lower limit of the upper band. The output of the device provides a signal responsively regulated in the effective bandwidth such that the output from the regulator can be similarly regulated. In power generation systems a narrow bandwidth can be effectively maintained to permit narrow variations of voltage. A micro-processor facilitates changing the regulated levels for the control device such that the output from the control device can be selectively and controllably changed as desired.

35 Claims, 10 Drawing Figures

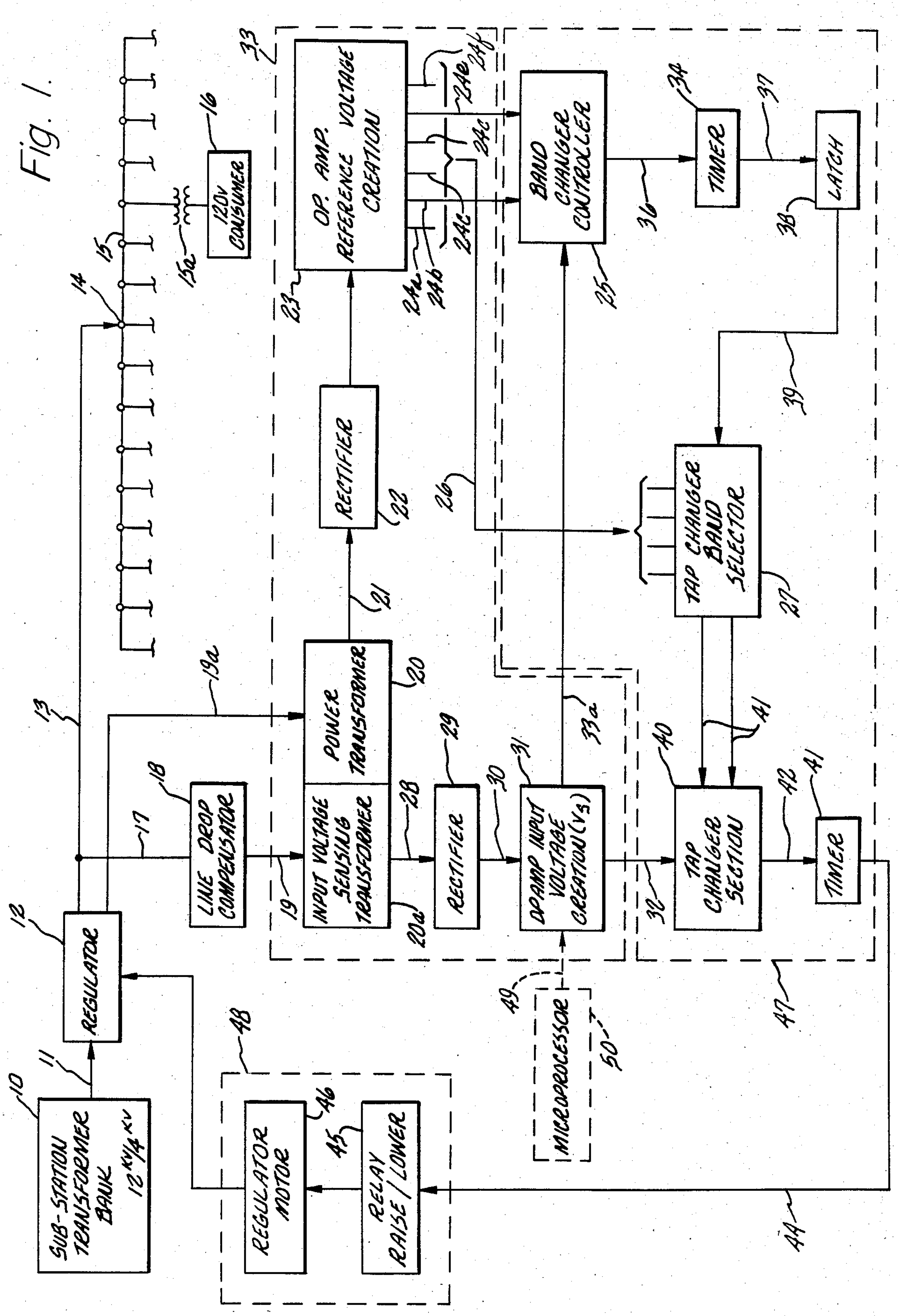
Fig. 1.
SUB-STATION TRANSFORMER BANK 12 KV/4 KV
REGULATOR
LINE DROP COMPENSATOR
INPUT VOLTAGE SENSING TRANSFORMER
POWER TRANSFORMER
RECTIFIER
OP. AMP. REFERENCE VOLTAGE CREATION
RECTIFIER
OPAMP INPUT VOLTAGE CREATION
120v CONSUMER
BAND CHANGER CONTROLLER
TIMER
LATCH
TAP CHANGER BAND SELECTOR
TAP CHANGER SECTION
TIMER
MICROPROCESSOR
REGULATOR MOTOR
RELAY RAISE / LOWER

VOLTAGE CONTROLLER

BACKGROUND OF THE INVENTION

This invention relates to voltage control. In particular it relates to voltage regulators, and more specifically to the regulation of voltage in power supply systems.

In power supply systems it is conventional to have a power supply from a generating source fed to a substation transformer bank which may conveniently operate at distribution voltages such as 12 Kv. or 4 Kv. depending on the substation. From that station, power is passed through a regulator along a feeder to what is known as a feedpoint. The feedpoint is located reasonably adjacent in particular consuming areas and from that point on primary distribution is made to various areas, and it is transformed down to a consumer utilization voltage, for instance, 120/240 volts. Between the regulator and the feedpoint may be a distance of a mile or more and there is normally no load between the regulator and the feedpoint.

During any particular day the load from the feedpoint varies. For instance during the middle of the day when appliances and air-conditioners are switched on, the load increases. This tends to force the voltage lower. Contrarily at night as appliances are switched off and industry turns down, the load decreases and the voltage at the feedpoint tends to increase. These fluctuations in high and low voltage at the feedpoint are undesirable. When the voltage is low, appliances, and particularly those which are sensitive to voltage, for instance, computers and the like, will not operate as effectively as they should, and contrarily when the voltage is high a waste in power generation is taking place since this excess voltage is clearly unnecessary for the operation of the system.

Control of this voltage, to date, has been affected by regulators. The structure of these regulators is effectively a transformer winding system, the primary of the winding being at the bus or system voltage, and the secondary winding being connected to the feeder. Within the secondary is an additional winding with taps controlled by a regulator motor which is usually a split-phase single phase motor so that it can go forward or reverse. In this manner windings are added or removed from the secondary of the regulator thereby regulating the output voltage on the secondary, namely the feeder line.

In a common system, the regulator step winding is divided into 32 steps each representative of $\frac{5}{8}$ths of a percent change in voltage and this quantitatively translates in a 120-volt system to each step change being 0.75 of a volt.

With the prior art, the voltage along the feeder and particularly at the feedpoint to consumers is controlled in a bandwidth of about 3 volts. It has not been desirable in the prior art to have a bandwidth any smaller than this since this would cause the regulator to step too often and thereby cause maintenance problems. Too tight a control, for instance 1.5 volts or less, in terms of the regulator performance, characteristics would cause overshooting and consequent hunting in the system. Thus, with the prior art systems the voltages in a conventional power supply system have varied in a range of 3 volts about the desired 120 volt supply. By having such a relatively wide bandwidth and the normally higher voltage during low load time, and normally lower voltage at high load times the regulators have reached levels which are undesirable for the aforesaid reasons.

Furthermore, with the prior art the broad bandwidth has been maintained by the utility to control the operations or step taken by the regulator to reasonable limits at the expense of tight voltage control at the feed point. In other words, it has not been easily possible with prior art systems to forcibly control feed point voltage within narrow limits which effects service to the customers, energy conservation, and system maintenance costs.

SUMMARY OF THE INVENTION

By the present invention there is provided a system which substantially overcomes the shortcomings of the prior art and provides for a bandwidth control in a power supply system which is substantially narrower than is presently used. This bandwidth can effectively be held to approximately one volt in a 120-volt system. Also, by the use of a micro-processor means in the control device of the invention it is possible for the regulator to change voltage levels at different times each day. Thereby the system can respond to trends in voltage to increase or decrease such that the utility can be more responsive to anticipated load demands. The utility can thereby program its supply voltage substantially more accurately according to anticipated demands than has previously been possible.

With the invention a control device is provided wherein effectively there are two overlapping bands and there is created between the upper level of the lower band and lower level of the upper band a new effective band. It is possible to "trap" the supply voltage normally within the effective bandwidth which is substantially and meaningfully smaller than has previously been achieved. When the voltage tends to decrease, the upper band is operational, and when the voltage tends to increase, the lower band is operational.

Having trapped the supply voltage within a narrower bandwidth it is possible with a micro-processor to program that desired narrow voltage level to be varied according to a predetermined program.

Applications of the voltage control device of the invention extend beyond the power utility applications and for instance, to any user entity which wishes to control voltage in a defined load system. Other applications of the narrow bandwidth control to other prime movers beyond power control are envisaged within the ambit of this invention. One such further example is the control of capacitor banks.

BRIEF DESCRIPTION OF THE DRAWINGS

FIG. 1 is a block diagram illustrating the controller of the invention in relationship to a power supply system from a utility to consumers.

Figures 2, 2A:
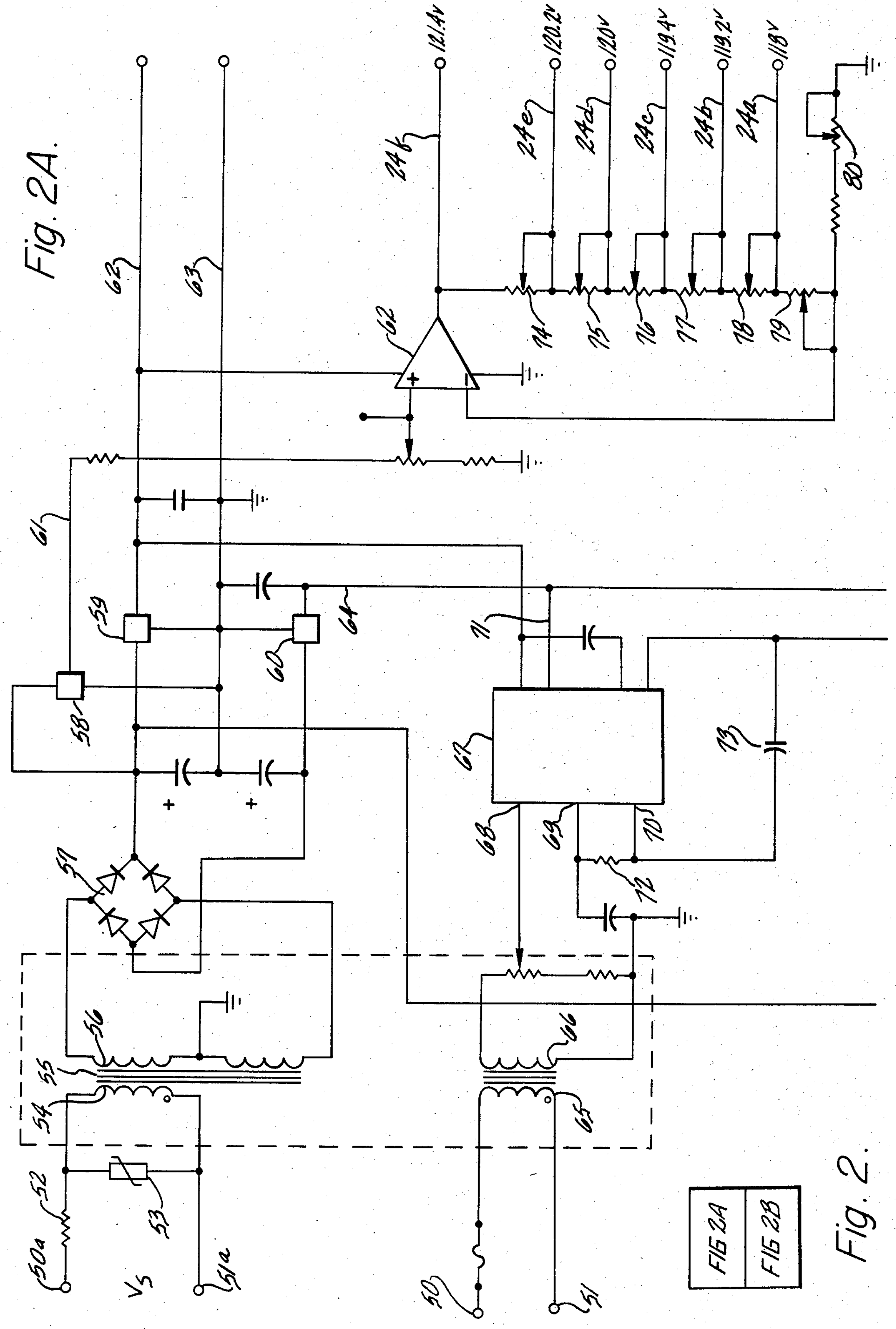

FIGS. *2a* and *2b* is a detailed schematic showing the power supply section of the voltage controller. The schematic of FIG. 2 is shown in phantom lines indicated as FIG. 2 in block diagram of FIG. 1.

FIGS. *3a* and *3b* is a detailed schematic showing the band selector section regulator tap changer section. The elements of FIGS. *3a* and *3b* are shown in phantom lines in the block diagram of FIG. 1.

Figures 2B, 4:
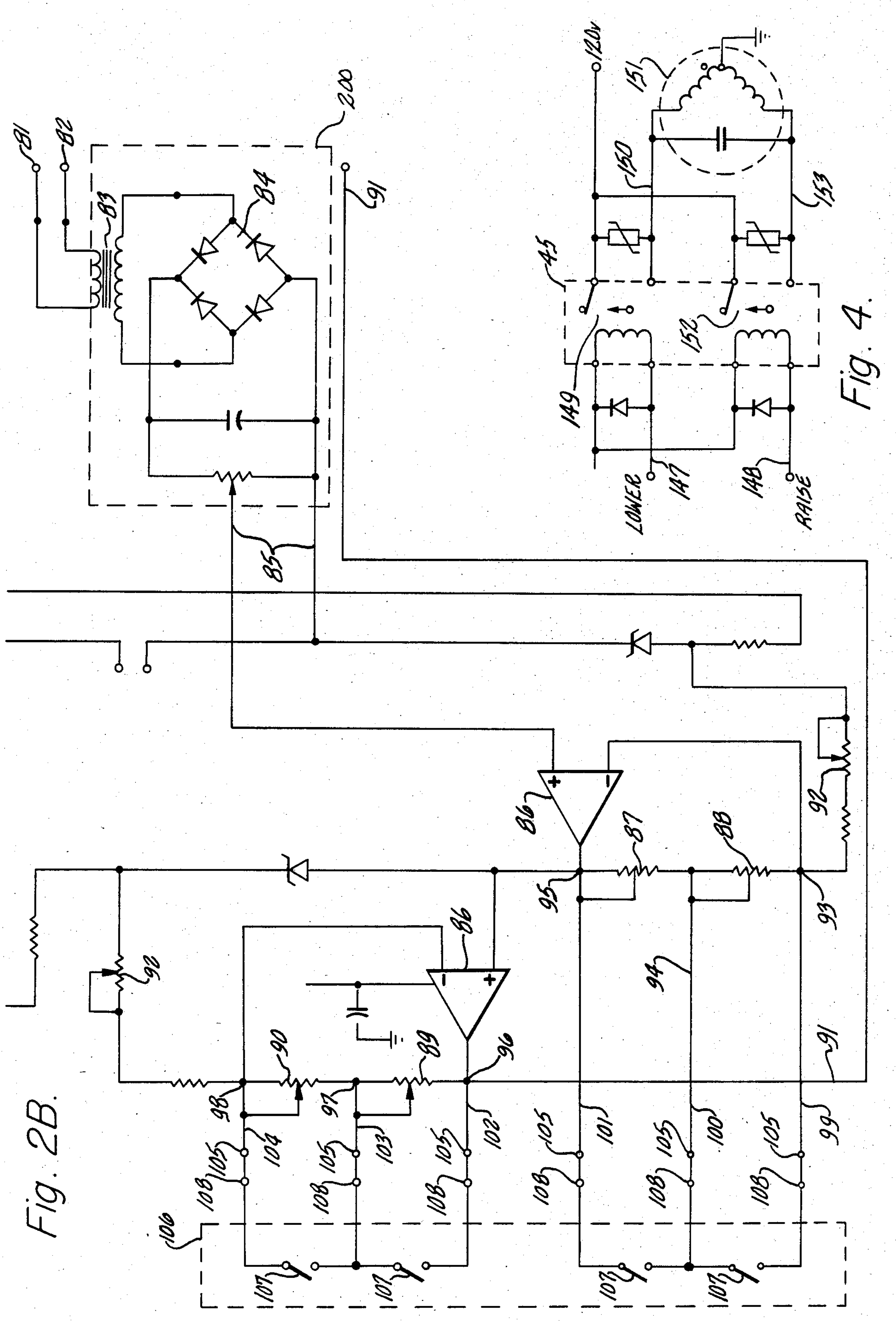
Figure 3A:
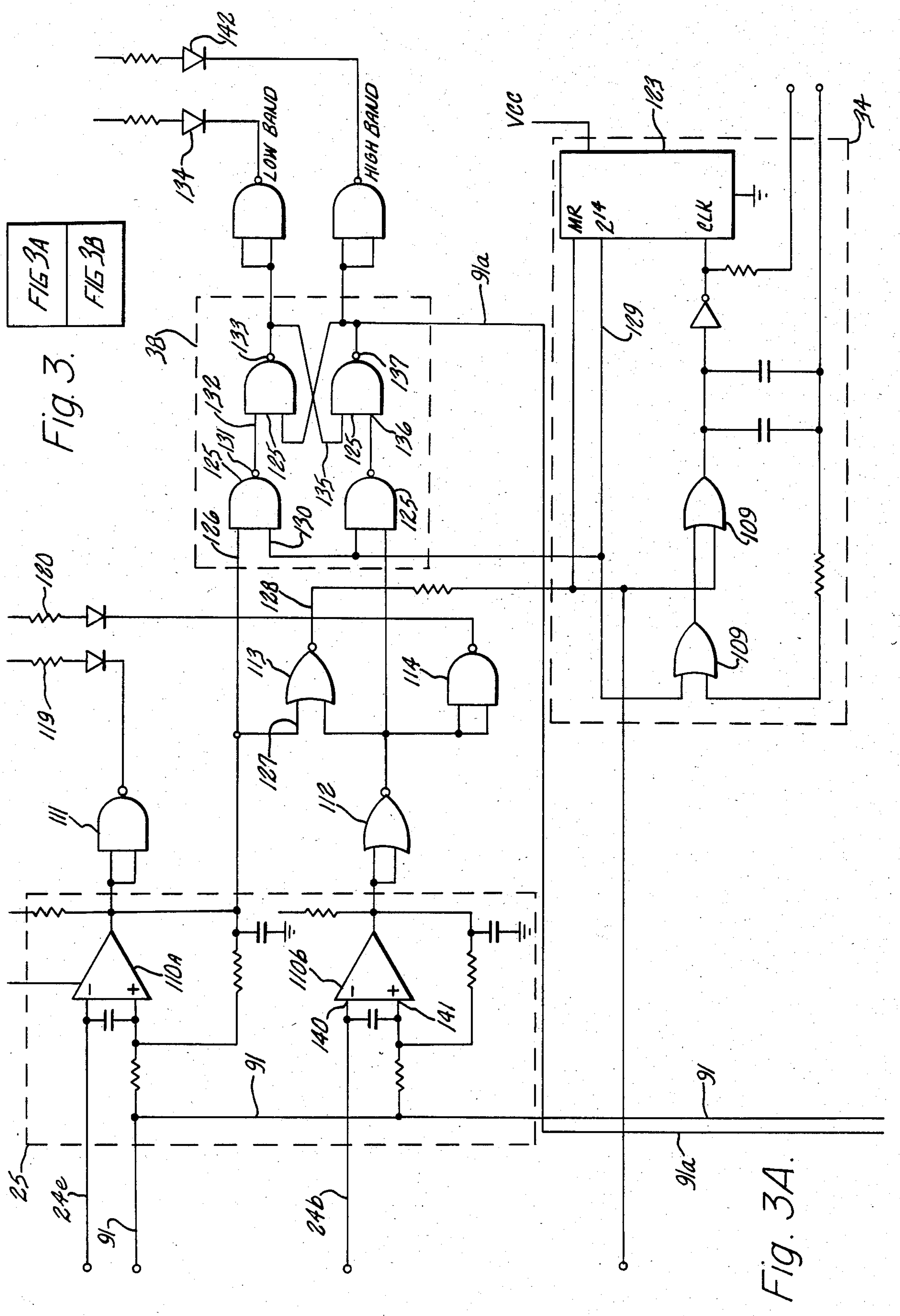
Figure 3B:
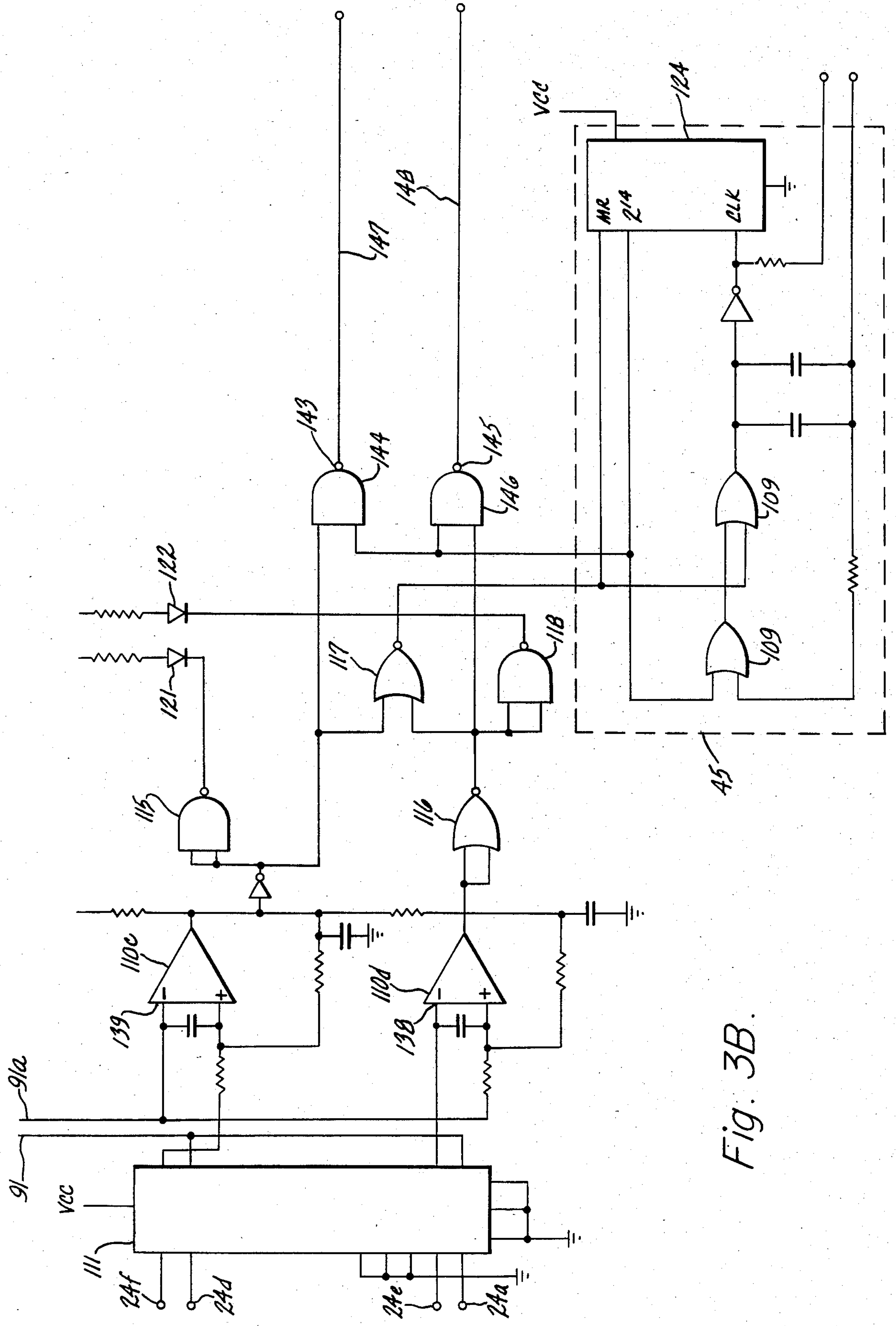

FIG. 4 is a detailed schematic showing the relays and a diagrammatic representation of a split phase motor, the relays being operated by the regulator tap changer section of FIGS. *3a* and *3b*. In phantom in FIG. 1 the relays of FIG. 4 are illustrated.

Figure 5:
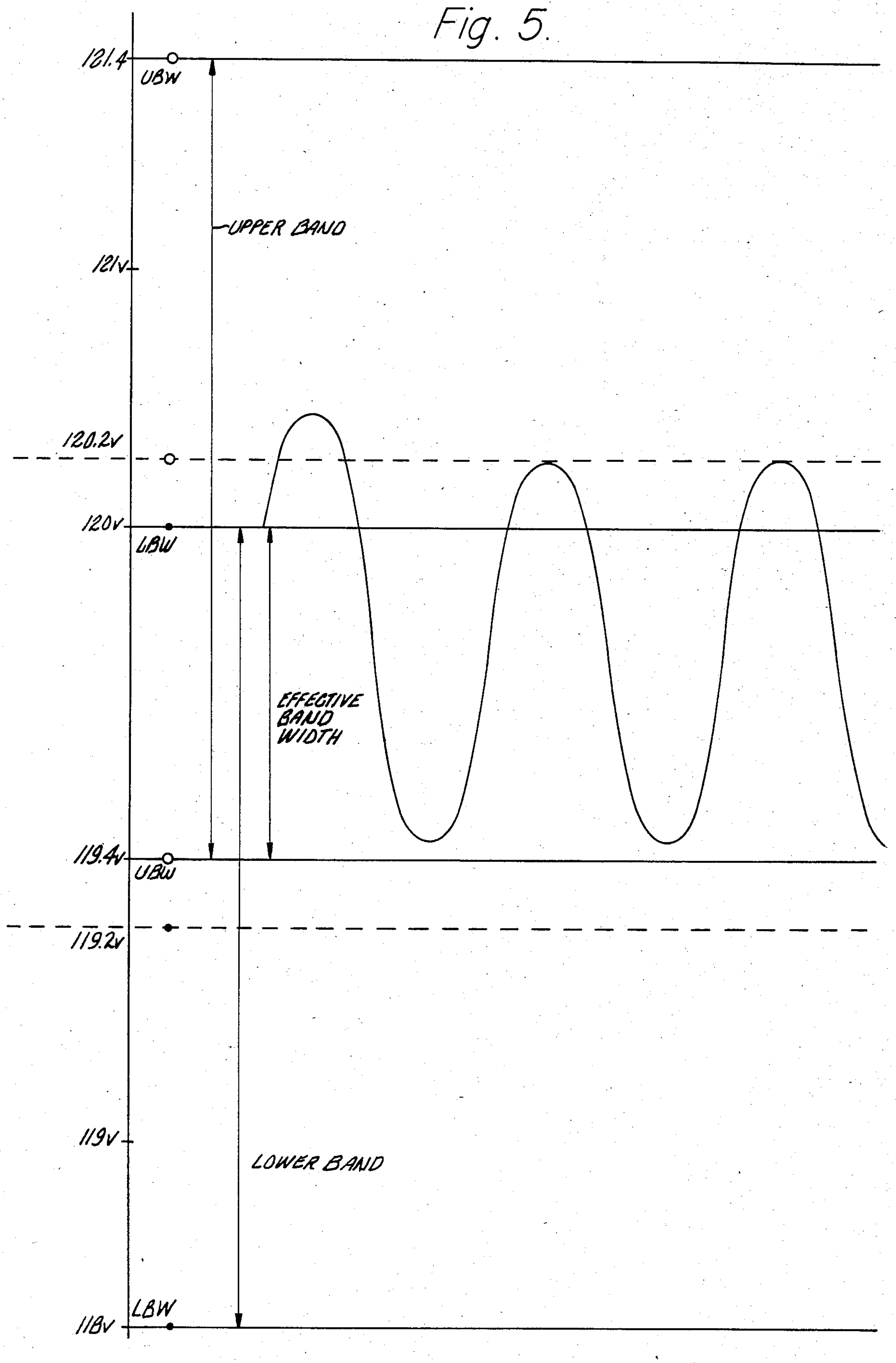

FIG. 5 is a static diagrammatic view illustrating the respective band in overlapping fashion and sensing bands to either side of the effective bandwidth.

Figure 6:
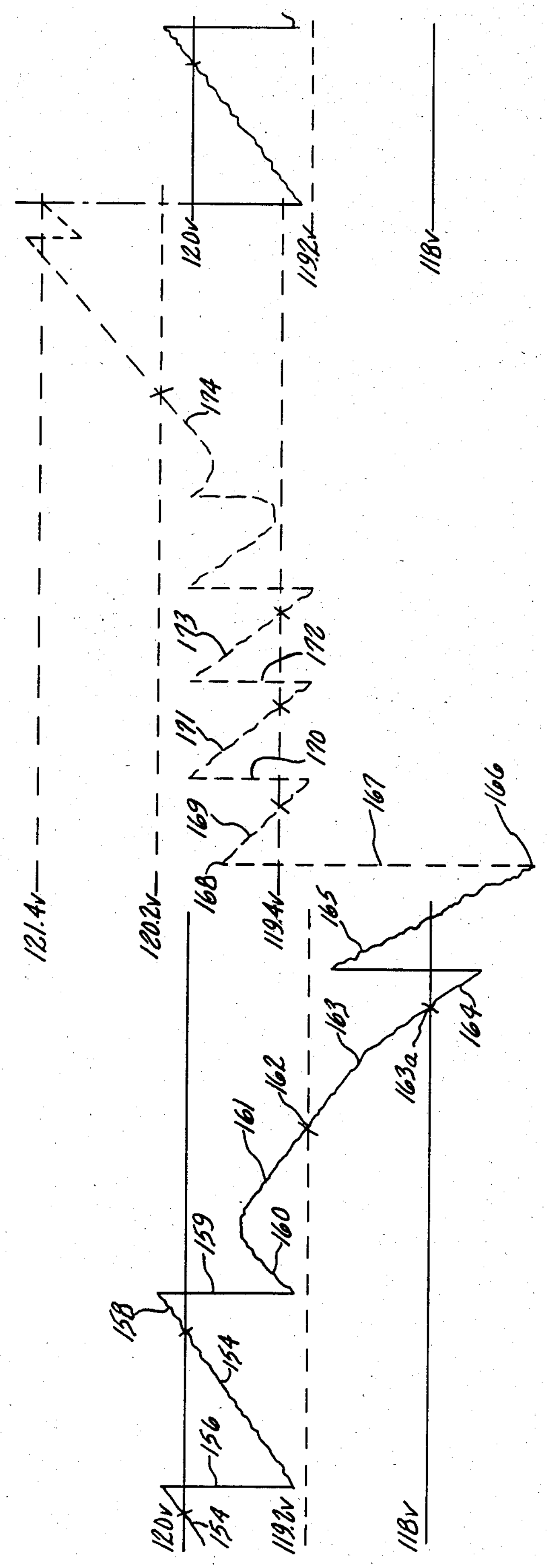

FIG. 6 is a graphical representation illustrating the change of voltage level progressively over a time period switching from one band to the other band.

DETAILED DESCRIPTION OF THE DRAWINGS

In FIG. 1 there is shown in block 10 a substation transformer bank 10*a* which receives power directly or indirectly from a power generating source. The output from the substation transformer bank is either 12 Kv. or 4 Kv. depending on the location of the bank in the power distribution system. The station buss 11 feeds a regulator 12 which passes the power along a feeder line 13 to a feed point 14. From the feed point 14 the power is distributed along the primary lines 15 and is transformed by transformers 15*a* to various consumers indicated by numeral 16. The voltage level at the feedpoint 14 is 120 volts after transformation, and the need of the regulator 12 is to maintain the voltage at that feedpoint as closes to 120 volts as possible. Along the feeder line 13 there is normally no load added on the system.

The regulator is constituted by primary and secondary transformer windings, the secondary winding having an additional secondary tap changeable winding whereby different numbers of windings can be put into the circuit according to the position of the tap contacts.

On the output side of the regulator 12 there is connected by line 17 a line drop compensator. This effectively compensates for the voltage drop occurring between the regulator 12 and feedpoint 14 and also measures the current through feeder line 13 such that the output from the line drop compensator 18 is a signal passing along line 19 which is the compensated voltage similar to the feed point voltage. This signal is passed to block 20*a* which constitutes the input sensing voltage transformer. The power transformer 20 is fed by line 19*a* with a 120-volt source from the regulator 12. The power transformer 20 feeds along line 21 to a rectifier 22 to generate a d.c. power to operate an op-amp reference voltage creation circuit 23. The output from the op-amp reference voltage creation is 6 reference voltages indicated by lines 24*a*, 24*b*, 24*c*, 24*d*, 24*e*, and 24*f*. The reference voltages 24*b* and 24*e* constitute threshold reference voltages for the band changer control 25 whereas the reference voltages on lines 24*a*, 24*c*, 24*d*, and 24*f* constitute the reference voltages to define two bandwidths and are fed as generally indicated along line 26 to the tap changer band selector 27. The adjustable reference voltages from lines 24*a* to *f* are respectively 118 volts, 119.2, 119.4, 120, 120.2 and 121.4 volts in this example.

The rectifier 22 also generates a negative d.c. voltage and a positive d.c. voltage which are used for power supply purposes for the p.c. board respectively and the voltage input signal creation. These are not shown in the block diagram.

From the input voltage transformer 20*a* there is a signal generated along line 28 an 8-volt a.c. sensing voltage which is passed to a true RMS converter AC/DC rectifier 29 and in turn along line 30 to an op-amp input voltage creation circuit 31. This creates the input voltage to the circuit logic which passes along line 32 and 33*a* to the other portions of the circuitry. The input power stage for the system is shown within the phantom lines 33.

The next portion of the system includes the band selector section which is constituted by the band changer controller 25 which apart from receiving the signals 24*b* and 24*e* which are the band sensing change signals also receives the input voltage signal Vs along the line 33*a* from the op-amp 31. When the signal along line 33 passes the high/low circuit threshold dictated by the appropriate threshold voltage 24*b* or 24*e*, whichever is operative at the appropriate time, then the controller 25 initiates a process to change the band. This is affected after a predetermined time established by timer 34 which cooperates with a band change of controller along line 36. After a predetermined time a signal is sent along line 37 to the latch 38 which in turn signals along line 39 to the tap changer band selector 27 for a band change. The input signal along line 32 feeds the tap changer section 40 and likewise signals pass from the tap changer band selector 27 along lines 41 to the tap changer section 40. The tap changer section operates to maintain a voltage above the lower band level of the upper band or the upper band level of the lower band when those respective bands are operative. Should a change be necessary in the tap setting of the regulator to maintain this situation a signal is passed along line 42 to activate a timer 43. Should this change condition ensue for a predetermined time as set by the timer 43 a signal passed along line 44 to the relay raise or lower circuit 45. These relays in turn operate the regulator motor 46 to add or remove a winding from the regulator 12 as signalled.

The tap changer band selector and regulator tap changer section are illustrated within the phantom lines 47 of FIG. 1. The relays and regulator motor are illustrated within the phantom lines 48 of FIG. 1.

By this invention it is possible to maintain an effective bandwidth created between two overlapping bands defined between the upper band lower limit and the lower band upper limit and in this fashion the regulator operates to maintain the voltage at the feedpoint 14 normally in an effective narrow bandwidth of about one volt about the 120-volt nominal voltage level.

Should it be desired to program the control device of the invention to effect voltage level settings on a repetitive 7-day cyclical basis, different portions of op-amp 31 are effectively shorted out. This adjusts the input signal along line 32 and 33*a* and in turn operates on the programmed desired output change via signal along line 49 as dictated by the micro-processor 50. In this manner the system can be designed to operate for maximum voltage at peak time minimum voltage levels during the night and average voltage levels with average loading. Reference is now made to the detailed schematic drawings which set out the operative circuitry for a control device in accordance with the invention.

In FIG. 2, there is shown the power supply section which establishes an a.c. power supply voltage and d.c. to set the reference voltages for the controls and a d.c. voltage that is represented of the sensing voltage. Terminals 50 and 51 constitute the input from the line drop compensator, the signal being representative of the voltage as would appear at feedpoint 14. Terminal 50*a* and 51*a* constitute an input power voltage supply from the regulator 12. The signal passes through a current limiting resistor 52 and a spike limiting element 53 and in turn is fed as an a.c. signal to the primary winding 54 of an input transformer. The winding 54 constitutes part of a power transformer 55, the secondary winding 56 of the power transformer 55 passing through a full wave bridge rectifier 57 to create appropriate d.c. voltage signals. The output from the full wave bridge rectifier 57 passes to voltage regulators 58, 59, and 60 respectively. The output from regulator 58 generates along line 61, a plus 10-volt d.c. voltage to provide positive input for the reference voltage creation by the op-amp circuit 62. The voltage from the regulator 59 is a plus 15-volt d.c. along line 62 which is used together with the common ground line 63 to provide a 15-volt power supply for the printed circuit board. From the voltage regulator 60 there is a minus 15-volt d.c. supply along line 64 which is utilized in conjunction with the sensing transformer 65 to generate input voltage signal. The sensing potential on the secondary 66 from the transformer is adjusted to about 8 volts a.c. and this is fed into an a.c./d.c. converter device 67 through input 68 and 69. This device generates a true RMS a.c. to d.c. sensing voltage output on line 71, such voltage being representative of the input sensed a.c. voltage. Resistor 72 and capacitor 73 minimize the noise and maintains stability of the true RMS a.c./d.c. converter device 67.

The six reference voltages which are generated by this system are developed by the operational amplifier 62 operating conjunctively with the bank of resistors 74, 75, 76, 77, 78, and 79 which are variable resistors connected in series. Resistor 79 would constitute the overall control and main setting resistor so that the voltage level for the voltage regulator can be set in the desired range between 115 to 125 volts. As indicated in the system, the resistors 74, 75, 76, 77 and 78 have set the various voltage reference levels at 118 volts, 119.2 volts, 119.4 volts, 120 volts, 120.2 volts, and 121.4 volts respectively. To facilitate reading with the block diagram the output lines from the op-amp reference voltage creation circuitry are referred to as *24a*, *24b*, *24c*, *24d*, *24e*, and *24f*, respectively thereby correlating with the block diagram of FIG. 1.

Stable current in the op-amp reference voltage creation system is obtained by the circuitry associated with the op-amp 62 and the resistor 80 calibrates the range of the resistor 79 to match a face plate dial reading by controlling the amount of current through the reference resistors 74 through 78. The reference resistors 74 through 78 function independently of each other and when one is increased, the voltage between it and the adjacent resistors on either side are increased.

The op-amp 62 and the associated resistors 74 through 78 is an effective manner of achieving multiple stable reference voltages related to each other. These voltages are individually adjustable and are held stable by a constant current flowing through the resistor network. Resistor 79 sets the overall voltage level by moving all reference voltage up or down together. Resistor 80 calibrates the reference voltage system to the dial-face plate. The op-amp 62 is in a voltage follower configuration to stabilize output voltage.

The inputs 81 and 82 respectively are from a motor that drives the tap changer in the regulator 12 and the transformer 83 and full wave bridge rectifier 84 acts as a compensating circuit to remove the effective voltage drop caused by the motor starting such that along lines 85 there is passed to the op-amp input voltage creation element 86 and input voltage correction signal as necessary to maintain true sensing voltage to op-amp 86. The op-amp 86 is a two-part element and operates with the input d.c. voltage along line 71 and the correction signal along lines 85 to generate conjunctively with resistors 87, 88, 89, and 90 and input voltage signal along line 91 which feeds the input to the logic circuitry associated with the band change controller 25 and the regulator tap changer section 40. Resistor 92 facilitates calibration of resistors 87 through 90 to match with the face plate requirements. The adjustibility of resistors 87 through 90 allows the increase or decrease of the input voltage level transmitted on 91 to the tap changer section 40 and band changer control 25 of the schematic when the resistance is changed in the circuit. Thus, the desired value settings of the input voltage can be adjusted as required to change feedpoint voltage level.

Resistors 87 and 88 constitute a pair associated with the one-half of the op-amp 86, and resistors 89 and 90 constitute a second pair associated with the second-half of the op-amp 86. The lines connecting these resistors are tapped respectively at points 93, 94, 95, 96, 97, and 98 so that there are three ouput lines 99, 100, and 101 from the one-half of the op-amp 86 and three output lines 102, 103, and 104 from the other half of the op-amp 86. The effect of each pair of resistors 87 and 88 on the one hand and 88 and 89 on the other hand is to provide a range of voltage drop, each of three volts and collectively of six volts to either side of the effective input voltage signal. Thus, with the variation of resistors the input signal can be changed plus or minus 6 volts d.c. Resistors 87, 88, 89 and 90 in the relay outer circuit respectively through terminals 105 which are for connection to a micro-processor which would shunt out the resistors according to a micro-processor program to close or open shunts across the resistors change as the desired voltage input value along line 91 is sought to be changed. This change is then acted upon by the circuitry as if it were a normal change in the voltage on line 13 and this causes appropriate increases or decreases of the voltage level established and as set by resistor 79. The micro-processor which is suitably adapted to operate with the invention is, for example, produced by Signalline, a division of Time Mark Corporation micro-processor. It is a T.M.C. 4 used for a load controller.

With such programming capabilities the voltage level set by resistor 79 desired can be changed plus or minus 6 volts from a desired voltage level setting to occur on a 7-day repeat cycle. Thus, if the voltage level set by resistor 79 is to change about 120 volts, the voltage will change between 126 and 114 volts.

In a different embodiment if resistor 79 is set to establish a base voltage of 110 volts, then the range will be between 104 and 116 volts. Reference is now made to FIGS. **3*a* and 3*b* and the band selector section and tap changer section. Both sections work similarly in that they compare the input voltage along line 91 to the functioning reference voltages on lines *24a*, *24b*, *24c*, *24d*, *24e*, and *24f*. When the input voltage on line 91 exceeds the reference voltage on the high side of the band or is less than the reference voltage on the low side of the band, it starts a timer action through circuit elements 109 to delay the action for a given period. After the timers 123 or 124 have timed out, the sections either change the reference voltages as seen by the comparator 110*c* or 110*d* or it causes a raise or lower operation in the regulator motor 46 by closing or opening relays 45**.

The band changer controller 25 and the tap changer section 40 employed a voltage comparator 110, limbs **110*a* and 110*b* of the comparator receive band reference voltages 120.2 and 119.2 respectively. Limb 110*c*** of the "comparator" receives either the reference voltage 120 or 121.4 along line 24*d* or 24*f* as its one input, and the comparator limb 110*d* receives either the reference voltage 119.4 or 118 from input line 24*c* or 24*a* respectively as its input. The determination of which of those two pairs of voltages are received is affected by the tap changer band selector 27 (in the block diagram of FIG. 1).

The operation of the tap changer band selector 27 is that when collectively reference voltages 118 and 120 along reference line 24*a* and 24*d* are being applied to the tap changer section 40 then the lower bandwidth is operative. When alternatively the reference voltages 119.4 and 121.4 along lines 24*c* and 24*f* are being applied to the tap changer section 40, then it is the upper bandwidth which is operative. The lower or upper band is then applied to the two limbs of the voltage comparator 110*c* and 110*d* respectively of the voltage comparator 110.

The output limbs 110*a* and 110*b* respectively feed the gates 111, 112, 113, and 114 associated with the band change controller, and the output from limbs 110*c* and 110*d* of the tap changer section feed gates 115, 116, 117, and 118 respectively. The outputs of gate 111 and 114 and 115 and 118 are connected to LED's 119, 120, 121 and 122 respectively. The outputs from gates 113 and 117 are respectively connected to the timer circuits element 34 for the band change controller and timer circuit element 43 for the tap changer section. These timer circuits each have associated with them a timer integrated circuit chip 123 and 124 respectively. Also, associated with the band changer controller in switch 38 is effectively an r.s. latch constituted by the gate network 125.

Operation of the electronic circuitry associated with the band change controller 25, tap changer band selector 27, tap changer section 40, timer 123, timer 124, and latch 38 is typically as follows: when the input voltage signal on line 91 exceeds 120.2 volts this activates the 110*a* limb of the voltage comparator causing the output to go high. This in turn causes the 111 gate to go low and the LED 119 to turn on indicating that the voltage is above the bandwidth setting. This also provides a high signal to the pin 126 on the input of gate network 125 and pin 127 on the input to gate 113. At this point the output pin 128 of gate 113 goes low and allows the r.c. network to start oscillating and creating the clock pulses for the timer i.c. 123 to count.

When the time has expired, pin 129 of the timer i.c. 123 goes high this makes the pin 130 of the gate 125 high and pin 131 goes low. This also makes pin 132 of the gate 125 go low and pin 133 goes high and turns on LED 134 indicating that the system is now operating in the lower band, that is nominally 118 to 120 volts.

This change was made when pin 133 went high and this forces pin 135 high and 136 is already high and therefore pin 137 goes low which forces the reference voltage change through the tap changer band selector 111 to pins 138 and 139 of limb 110*c* and 110*d*. This status will remain until the input voltage signal on line 91 goes below the lower limit of 119.2 volts on the line 24*b* and pin 140 of the upper comparator limb 110*b*. This change on the input voltage signal will be transmitted to operate comparator limb 110*d* through pin 141. This will force a change to the reference voltages of 119.4 volts and 121.4 volts on pin 138 of comparator section 110*d* and pin 139 of comparator section 110*c*.

The circuitry will now work similarly to indicate changes in the band. For instance, through the gate network 125 and timing circuit gates 109 the effective changes in the tap change band selector can be affected as appropriate. LED 142 will indicate when the circuit switch is to the high band operation, nominally between 119.4 and 121.4 volts. When LED 142 is operative, a signal passed along line 91*a* to selector 111 activates the high band reference voltages 24*f* and 24*c*.

The operation of the gating circuit 115, 116 together with the gates 117 and 118 its respective pins and the timer chip 124 with the timer circuit gates 109 of the tap changer section 40 is similar to that described electronically with regard to the band changer controller 25. Thus, after a prescribed time period as determined by the timer 124 of the tap changer section 40 the pin 143 of gate 144 or the pin 145 of gate 146 provide the signal along line 147 or 148 respectively, the signal along 147 being a signal to lower the tap setting on the voltage regulator motor and the signal along line 148 is a signal to raise the tap setting on the voltage regulator motor 46. A signal along line 147 will operate relay 149 of relay system 45 and in effect a lower signal to pass along line 150, such signal being in the form of a 120v power to a split-phase motor diagrammatically illustrated by numeral 151. This effectively closes the motor either to go forward or backward according to the relationship of the motor with the regulator.

There is also provided, optionally, a motor compensation circuit 200 designed to compensate for voltage drop created in the input voltage by the operation of the stepping motor when it is connected to the same transformer that is creating the input voltage for the system.

A signal along line 148 will cause relay 152 of the relay section 45 to close thereby passing 120 volt power along line 153 which causes a raise signal to pass to the split-phase motor 151 and thereby change the regulator tap setting. This change in the regulator up or down effectively causes a change in the output voltage from the regulator, namely along line 13, and such change is referred back to the control device of the invention along the input lines 50 and 51 of FIG. 2.

When the input voltage has been raised above limits set by the reference voltage on pin 138, the voltage comparator 110*d* will go high. The gate 116 will go low, gate 117 will go low, and thus with cause timer 124 to reset which causes the raise relay contacts 152 to open and remove the 120 volt power from motor 151. This stops the stepping action.

In FIG. 5 there is shown a static representation of the various voltage levels constituting a lower bandwidth and an upper bandwidth with the effective overlap between the upper level of the lower bandwidth being at 120 volts and the lower level of the upper bandwidth being at 119.4 volts. The upper bandwidth is defined between 119.4 volts and 121.4 volts, whereas the lower bandwidth is defined between 120 volts and 118 volts. Between the referred to upper level of 120 volts and lower level of 119.4 volts there is formed an effective new bandwidth in which the input voltage can normally be effectively restrained or trapped. It will be noted that this bandwidth extends for 0.6 volts in distance which is the same as the gap of each step in the regulator motor 151. The 0.6 voltage overlap is adjustable, normally between 0.5 to 1 volt, and may preferably be 0.75 volts.

Above the 120 volt level of the effective bandwidth is 120.2 volt level which constitutes a voltage reference threshold to operate the band changer controller. Below the lower level of the upper band at 119.2 volts is the voltage reference threshold to operate the bandwidth changer 25.

In operation of the control device of the invention when operating in the upper band, the effective voltage reference which is operational with the input voltage is the lower level of that band, namely 119.4, the band change reference voltage 120.2 and the upper level reference voltage of 121.4. When the voltage remains above that level and below 120.2 volts the upper band is operational. Should the voltage climb above the 120.2 voltage threshold and remain there for a predetermined time which may vary from one minute to 15 minutes, depending on the system in which the control device of the invention is working, the system then switches to the lower band, namely the operational levels now change between 118, 119.2 and 120 volts. As the voltage is now above the top of the bandwidth, namely greater than 120 volts the control system acts to step the voltage down below 120 volts. The system will continue operating there so long as the voltage does not drop below 119.2 volts, which is the threshold voltage level operational when the lower band is operative. Should the voltage level drop below 119.2 volts for a predetermined time according to the system then the control device will switch to the upper band again, and as the voltage is below the acceptable bandwidth the control device will activate the regulator tap changer to step the voltage into the effective new bandwidth of 119.4 and 120 volts.

It will be noted that the two voltage references forming the threshold levels for activating the band changer controller are spaced one volt apart, namely, between 119.2 and 120.2 volts. This effectively permits for a narrow bandwidth, between 119.4 and 120 volts to be the effective new operational normal bandwidth and permits for minor excursions, 0.2 volt either side thereof, thereby giving an approximate one volt operational effective bandwidth.

By reference to FIG. 6 the dynamic operation of the system is illustrated. The system is shown commencing operation with the lower band in effect, namely between 118 and 120 volts. These are the two reference voltages regulating the bandwidth. Additionally, there is operational the threshold reference voltage for the band changer controller, namely 119.2 volts. The input voltage operates normally as indicated by line 154. At this point there is a normal rising voltage, the voltage can exceed 120 volt voltage reference of the bandwidth as shown at 155 and after a time out determined by the timer of the tap changer section, a 0.75 volt drop occurs as the regulator steps down as shown by 156 of the voltage input. The voltage therefore now stays below the 120 volt upper level of the effective bandwidth. The voltage is seen to remain still above the 119.2 sensing voltage threshold. This normal rising voltage is again repeated along the voltage portion 157, it exceeds the voltage threshold of 158 and after a time out the regulator steps down as indicated by 159 again remaining below the voltage level. The voltage at this stage rises as little as indicated in 160 and then starts to fall away as indicated by 161. When the voltage passes the voltage reference threshold 119.2 at 162 it starts a timer 123 to change the band to the upper band. The voltage moves down as indicated by 163 and at 164 starts the timer 124 for the tap change then the regulator steps up but does not reach the voltage threshold 119.2 volts but instead continues downwardly at 165. After timing out at time 166 the change takes place to the new band, namely the upper band between the level 119.4 volt and 121.4 volt. At this point the voltage is now below 119.4 volts and the tap changer timer 124 times out and the regulator is stepped upwardly as indicated by line 167 because it is below the lower limit of the upper bandwidth 119.4 volts. This continues until it reaches point 168 which is above the lower limit of the upper bandwidth.

When the upper bandwidth is operational there is also operational the voltage reference threshold sensing voltage of 120.2 volts which is the other portion of the changed band.

The voltage trend is now downwardly as indicated by 169 and when it drops below 119.4 volts for a time period the voltage regulator raises the voltage again at 170 keeping it above bandwidth 119.4 but below 120.2 volts. This is repeated again through the voltage patterns 171, 172, 173. Voltage pattern 174 tends to raise the voltage above the threshold voltage of 120.2 volts and after it surpasses this for a time out period as dictated by the timers 123 associated with the band selector, the signal effectively passes to change the band downwardly and once again the lower band level 120 volt and 118 volt with threshold level 119.2 volt become operational.

With this arrangement of the operation the voltage is effectively normally trapped between the values of 119.2 and 120.2, but more specifically in the narrower bandwidth of 119.4 volt and 120 volt.

Should excursions take place lower than the 118 threshold or higher than 121.4 threshold the voltage regulator is effective to step the voltage up or down to maintain the bandwidth by the 0.75 volt steps characterizing the voltage regulator.

In the most efficient regulation system the overlap in voltage reference will be approximately equal to the size of the minimum voltage step of the regulator involved. For effective operation of the system there does, however, not have to be exact equivalence of these voltages.

With this invention it is now possible to control the voltage in this narrow effective band of approximately one volt. Thus, by employing a micro-processor to effectively signal that the desired voltage level is to be at different times of the day and is to be approximately one volt of any specifically desired voltage a substantial new and important application is provided for specific and discreet control of voltage supplies to consumers at large and industry and particular applications specifically. For instance, with this control it is now possible for a large consumer of electricity to control voltage level, for instance, at night time to peripheral lighting in a plant to levels which are different, and may be less than is otherwise required in the operational section of the plant. Substantial expenditure savings can thereby be expected.

As indicated, it is envisaged that this invention has applications beyond utility power supply and consumption and many examples and applications of prime movers other than regulators are possible. These are, for instance, capacitor bank control and the determination of switching the bank or when a low voltage limit is sensed and/or when a high voltage limit is sensed. Other applications could be in industry where apparatus, such as motors, are voltage sensitive such that at different levels the apparatus would be turned "off" or "on" as required.

The operation of the system described could be contained within a microprocessor programmed to obtain the same functions which are set out by any of the examples above. For instance, the logic circuits, voltage reference circuits, timers, gates and other components could be integrated into the processor.

It should be understood that the invention is not to be limited to the particular embodiment shown and described for many modifications and variations thereof will readily be apparent to those skilled in the art, and it is therefore intended that the claims cover all changes and modifications as fall within the spirit and scope of the invention.

I claim:

1. A control device for creating a controlled output signal comprising means for monitoring an input voltage signal to said device, means for defining at least two bands, said bands being overlapping, means for establishing reference signals to define at least an upper limit and a lower limit respectively of at least two bands, said bands constituting an upper band and a lower band, means for selecting the appropriate band thereby normally restraining the input voltage signal in said effective bandwidth, and means for generating an output signal regulated by said effective bandwidth.

2. A control device as claimed in claim 1, wherein the monitoring means, means for defining the bands, means for selecting the appropriate bands and means for generating said output signal are programmed into a microprocessor.

3. A control device as claimed in claim 1 wherein the output signal effects input voltage changes.

4. A control device as claimed in claim 3, wherein the output signal activates a prime mover, the output of said prime mover being fed back through regulator means to the input voltage signal.

5. A control device as claimed in claim 3, wherein the output signal activates regulator means, and the regulator means feeds the adapted output signal to the input of the control device.

6. A control device as claimed in claim 5 wherein the regulator means further outputs a controlled voltage responsive to the output signal controlled by said bandwidth.

7. A control device as claimed in any one of claims 1 to 4 wherein the size of the effective bandwidth is adjustable.

8. A device for controlling an output voltage signal for operating voltage regulator means, said device comprising:

means for receiving an input voltage signal from the output side of the regulator means, said input voltage signal in uncontrolled state tending to rise or decrease varibly;

means to establish reference voltages to define at least an upper voltage limit and a lower voltage limit respectively of at least two bands, said bands constituting an upper band and a lower band;

means for selecting reference voltages such that the upper limit of the lower band is employed to normally restrain the rise of said input variable voltage signal as an upper limit and the lower limit of the upper band is used to normally restrain the decrease of said input variable voltage signal as a lower limit thereby creating an effective bandwidth between said lower voltage limit of the upper band and said upper voltage level of the lower band;

means for generating an output voltage signal determined by control imparted to the input signal to restrain said input signal in the effective bandwidth, said output voltage signal in turn activates said regulator means to control the output from the regulator in the effective bandwidth.

9. A device of claim 8, wherein the two bands are adjacent to each other, the effective bandwidth being defined between the upper limit of the lower band and the lower limit of the upper band, and effectively a single regulator tap change below the upper limit of the lower band and effectively a single regulator tap change above the lower limit of the upper band.

10. A device as claimed in claim 8, wherein the two bands are spaced apart, such that the effective bandwidth includes the spacing between the bands and effectively a single regulator tap change above the lower limit of the upper band and effectively a single regulator tap change below the level of the upper band.

11. A device for controlling an output voltage signal comprising:

means for receiving an input voltage signal, which input voltage signal in uncontrolled state would tend to rise or decrease variably;

means for establishing reference voltages to define at least an upper voltage limit and a lower voltage limit respectively of at least two bands, said bands constituting an upper band and a lower band;

means for selecting reference voltages such that the upper limit of the lower band is employed to normally restrain the rise of said input variable voltage signal as an upper limit, and the lower limit of the upper band is used to normally restrain the decrease of said input variable voltage signal as a lower limit, thereby creating an effective bandwidth substantially between said lower voltage limit of the upper band and said upper voltage limit of the lower band;

means for selecting appropriately the upper band or the lower band; and means for generating an output voltage signal determined by control imparted to the input variable signal to normally restrain said input signal substantially within the effective bandwidth, said output voltage signal in turn controlling the input signal substantially in the effective bandwith.

12. A device as claimed in either claim 11 or 8, including means for changing the input voltage signal, said changes being affected by a micro-processor programmed to generate said desired changes in the input voltage signals to the control device thereby in turn to ensure the output voltage signal responsive to the desired programmed signal.

13. A device as claimed in either claim 11 or claim 8 wherein the reference voltage establishing means includes an operational amplifier connected in input-output follower configuration, a resistor network connected between the amplifier output and input, and outputs between the resistors for obtaining the reference voltages.

14. A device as claimed in claim 13 wherein the resistors are variable thereby to provide variable reference voltages.

15. A device as claimed in either claim 11 or claim 8 wherein there are four reference voltages, said four reference voltages respectively defining two pairs, a first pair for the upper band and a second pair for the lower band.

16. A device as claimed in claim 15 wherein the upper band overlaps with the lower band.

17. A device as claimed in claim 15 including two further reference voltages, each one of those additional reference voltages being related to the bands, the additional reference voltage for the upper band being in the upper band and at a value at least as high as the upper value of the lower band, the additional reference voltage for the lower band being between the limits of the lower band and at least no higher than the lower voltage for the upper band.

18. A device as claimed in claim 15, wherein the reference voltages constituting the upper limit of the upper band and the lower limit of the lower band are normally non-active for output signal control, the input voltage being contained in the effective bandwidth constituted by the other two reference voltages.

19. A device as claimed in claim 15, wherein the upper voltage limit of the upper band and the lower voltage limit of the lower band are effectively operational when the input voltage tends excessively high or excessively low respectively.

20. In a power distribution supply including a power supply to regulator means, an output from said regulator means for feeding a feedpoint in the power distribution system from which feedpoint, power is distributed to consumers, and wherein the voltage at the feedpoint is to be maintained substantially within an effective bandwidth, said power distribution supply comprising:

regulator means between said power supply and a feeder to the feedpoint, line drop compensator means effectively connected to the feeder between the regulator and the feedpoint for providing an equivalent measure of load change on the feeder and thereby to output a compensated voltage equivalent to a voltage at said feedpoint;

a control device receiving a compensated voltage input signal, said signal normally being variable and tending to rise or decrease as load characteristics change at the feedpoint;

means for reading the compensated input voltage, representative of the voltage at the feedpoint;

means for establishing reference voltages to define at least an upper voltage limit and a lower voltage limit respectively of at least two bands, said bands constituting an upper band and a lower band;

means for selecting reference voltages, such that the upper limit of the lower band is employed to restrain the rise of said variable compensated voltage signal as an upper limit and the lower of the upper band is used to restrain the decrease of said variable compensated voltage signal as a lower limit, thereby creating an effective bandwidth substantially between said lower voltage limit of the upper band and said upper voltage limit of the lower band;

band selector means for determining the need for a band change from the upper band to the lower band or from the lower band to the upper band thereby to effectively activate either the upper limit of the lower band or the lower limit of the upper band to normally restrain the input voltage in the effective bandwidth;

switch means to selectively change bands for changing the reference voltage for a top changer means; and relay means for responding to a signal from said tap changer means thereby to raise or lower the tap change control by activating a regulator motor means, and thereby effectively change the status of the regulator and the signal output from the regulator means.

21. A power distribution system as claimed in claim 20 including a micro-processor for programming changes in the control device thereby to ensure that the signal to said control device is desirably varied such that the output signal of the regulator is responsive to the microprocessor programming.

22. In a power distribution supply including a power supply to regulator means, an output from said regulator means for feeding a feedpoint in the power distribution system from which feedpoint, power is distributed to consumers, and wherein the voltage at the feedpoint is to be maintained substantially within an effective bandwidth, said power distribution system comprising:

regulator means between said power supply and a feeder to the feedpoint;

line drop compensator means effectively connected to the feeder between the regulator and the feedpoint for providing an equivalent measure of load change on the feeder and thereby to output a compensated voltage equivalent to a voltage at said feedpoint;

a control device receiving a compensated voltage input signal, said signal normally being variable and tending to rise or decrease as load characteristics change at the feedpoint;

means for transforming said compensated voltage to a representative d.c. signal;

means for generating at least six reference voltages for establishing switching limits;

means for establishing the reference voltages to define at least an upper voltage limit and a lower voltage limit respectively of at least two bands, said bands constituting an upper band and a lower band;

means for selecting reference voltages, such that the upper limit of the lower band is employed to normally restrain the rise of said d.c. variable voltage signal as an upper limit and the lower limit of the upper band is used to normally restrain the decrease of said d.c. variable voltage signal as a lower limit, thereby creating an effective bandwidth substantially between said lower voltage limit of the upper bandwidth and said upper voltage limit of the lower bandwidth;

band selector means for determining the need for a band change from the upper band to the lower band or from the lower band to the upper band thereby to effectively activate either the upper limit of the lower band or the lower limit of the upper band to normally restrain the input voltage in the effective bandwidth;

switch means to selectively change bands for changing the reference voltage for a tap changer means; and relay means for responding to a signal from said tap changer means thereby to raise or lower the tap change control by activating a regulator motor means, and thereby effectivly change the status of the regulator and the signal output from the regulator means.

23. A system as claimed in either claim 20 or 22 wherein the effective bandwidth size is related to the size of a step change of the regulator means.

24. A system as claimed in either claim 20 or 22 including timing means for determining a voltage trend and thereby a need for a band change, said band change only be affected after a predetermined time period wherein the compensated voltage signal is beyond the effective bandwidth.

25. A system as claimed in claim 24 including timing means for the tap changer section and the relay means for effecting a position change of the tap changer, such timer means operating cooperatively with the timing means for a band changer controller means.

26. A system as claimed in either claim 20 or 22 wherein the voltage signal being regulated is substantially 120 volts, and the effective bandwidth is maintained at substantially 1 volt.

27. A system as claimed in claim 26 wherein the effective step change of the regulator means is 0.75 volt.

28. A system as claimed in claim 27, wherein the limits of the upper bandwidth are substantially 119.4 volts and 121.4 volts respectively and the limits for the lower bandwidths are substantially 118 volts and 120 volts respectively.

29. A device for controlling an output voltage signal comprising:

means for receiving an input voltage signal normally tending variably to rise or decrease;

means for creating an effective bandwidth between an upper voltage level of a lower band and a lower voltage level of an upper band thereby to form said effective bandwidth, said effective bandwidth being relatively narrower than either the upper band or the lower band;

means for creating a sensing band no less than the effective bandwidth;

means for sensing a voltage excursion beyond the sensing band for predetermined time period; and means for switching between the upper band and the lower band respectively to thereby maintain the effective bandwidth and thereby cause the output voltage signal to return from the excursion into the sensing band to the effective bandwidth.

30. A control device as claimed in claim 29 wherein during operation in the upper band, the voltage reference for the sensing band is between the upper limit of the upper band and the upper limit of the lower band, and during operation in the lower band the reference voltage for the sensing band is below the lower limit of the upper band and above the lower limit of the lower band.

31. A method of providing a controlled output voltage signal to control a signal which in uncontrolled state would tend to rise or decrease variably comprising:

establishing reference voltages to define an upper voltage limit and a lower voltage limit respectively of at least two bandwidths, said bandwidths constituting an upper bandwidth and a lower bandwidth;

selecting reference voltages such that the upper limit of the lower band is employed to normally restrain the rise of the input variable voltage signal as an upper limit and the lower limit of the upper band is employed to normally restrain the decrease of said input variable voltage signal as a lower limit thereby creating an effective bandwidth between said lower voltage limit of the upper band and said upper voltage limit of the lower band, operating in the upper band with its lower limit effective;

maintaining such upper band position until the signal passes a further reference threshold voltage beyond the upper limit of the lower band for a predetermined time whereupon a band selector operates to switch the reference voltage to operate on the lower band;

operating in the lower band with its upper limit effective;

maintaining such lower band operation until the signal tends below a further voltage threshold reference below the lower limit of the upper band for a predetermined time; and returning to the upper band so as to force the input voltage to operate above the upper band lower limit.

32. A method of creating a controlled output signal comprising monitoring an input voltage defining at least two bands which overlap, an effective bandwidth being established between the upper limit of the lower band and the lower limit of the upper band, selecting the appropriate band for normally restraining the input voltage signal in said effective bandwidth, and generating an output signal regulated in said effective bandwidth.

33. A method as claimed in claim 32 wherein the monitoring of the input voltage, selection of the appropriate band, restraint of the input voltage, and generation of the output signal are effected by a programmed microprocessor.

34. A method for controlling an output voltage signal comprising:

receiving an input voltage signal, which input voltage signal in uncontrolled state would tend to rise or decrease variably;

establishing reference voltages to define at least an upper voltage limit and a lower voltage limit respectively of at least two bands, said bands constituting an upper band and a lower band;

selecting reference voltages such that the upper limit of the lower band is employed to normally restrain the rise of said input variable voltage signal as an upper limit, and the lower limit of the upper bandwidth is used to normally restrain the decrease of said input variable voltage signal as a lower limit, thereby creating an effective bandwidth between said lower voltage limit of the upper band and said upper voltage limit of the lower band;

generating an output voltage signal determined by control imparted to the input variable signal to normally restrain said input signal within the effective bandwidth, said output voltage signal in turn being adapted to control the input signal substantially in the effective bandwidth.

35. A method of controlling an output voltage signal for operating voltage regulator means comprising:

receiving an input voltage signal from the output side of the regulator means, said input voltage signal in uncontrolled state tending to rise or decrease variably;

establishing reference voltages to define at least an upper voltage limit and a lower voltage limit respectively of at least two bands, said bands constituting an upper band and a lower band;

selecting reference voltages such that the upper limit of the lower bandwidth is employed to normally restrain the rise of said input variable voltage signal as an upper limit and the lower limit of the upper band is used to restrain the decrease of said input variable voltage signal as a lower limit thereby creating an effective bandwith between said lower voltage limit of the upper bandwidth and said upper voltage level of the lower band; and generating said controlled output voltage signal determined by control imparted to the input voltage signal by said regulator means to normally restrain said input voltage signal in the effective bandwidth, said output voltage signal in turn activate said regulator means to control the output from the regulator means normally in the effective bandwidth.

* * * * *